United States Patent
Fujita

(10) Patent No.: US 6,633,361 B1
(45) Date of Patent: Oct. 14, 2003

(54) LCD PANEL IN WHICH SIGNAL LINE TERMINALS HAVE SLITS TO ALLOW INSPECTION OF ALIGNMENT OF THE TERMINALS AND THE TCP LEADS

(75) Inventor: Akira Fujita, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 79 days.

(21) Appl. No.: 09/587,061

(22) Filed: Jun. 2, 2000

(30) Foreign Application Priority Data

Apr. 6, 1999 (JP) .......................................... 11-158577

(51) Int. Cl.[7] .......................................... G02F 1/1345
(52) U.S. Cl. ...................................... 349/152; 349/149
(58) Field of Search ................................ 349/149, 150, 349/151, 152

(56) References Cited

U.S. PATENT DOCUMENTS 5,270,848 A * 12/1993 Takabayashi et al. ......... 359/88
5,729,315 A * 3/1998 Takahashi et al. ........... 349/149
5,760,881 A   6/1998 Miyazaki et al.
6,184,966 B1 * 2/2001 Fujita et al. ................. 349/152

FOREIGN PATENT DOCUMENTS

JP          10-228029       8/1998
JP        11145373 A  *    5/1999   ............. G09F/9/00

* cited by examiner

Primary Examiner—Toan Ton
Assistant Examiner—Andrew Schechter
(74) Attorney, Agent, or Firm—Foley & Lardner

(57) ABSTRACT

A LCD display device includes a LCD panel unit and a LCD driver (TCP) for driving the LCD panel unit. The panel terminals of the signal lines are bonded to respective TCP leads of the LCD driver. The panel terminal has a slit therein for inspection of the alignment of the panel terminal and the TCP lead. If the alignment is achieved, light does not pass the slit whereas if the alignment is incomplete, light passes the slit, whereby the misalignment is detected by human eyes.

5 Claims, 10 Drawing Sheets

LCD PANEL IN WHICH SIGNAL LINE TERMINALS HAVE SLITS TO ALLOW INSPECTION OF ALIGNMENT OF THE TERMINALS AND THE TCP LEADS

BACKGROUND OF THE INVENTION (a) Field of the Invention

The present invention relates to a liquid crystal display (LCD) panel unit for use in a LCD device and, more particularly, to the structure of a LCD panel unit having a shield metallic film. The present invention also relates to a method for fabricating the LCD panel unit.

(b) Description of the Related Art

Active matrix LCD device is increasingly used for a variety of applications such as personal computer and mobile communication system. The LCD device generally includes a LCD panel unit for defining a plurality of LCD pixels and a pair of drive units (horizontal driver and vertical driver) implemented as drive ICs for driving the LCD pixels.

Patent publication JP-A-10-228029 proposes a LCD panel unit, such as shown in FIG. 1A as a front view thereof. FIG. 1B is a sectional view taken along line A—A in FIG. 1A for showing the detailed structure of the TFT panel in the LCD panel unit. In FIG. 1B, the TFT panel includes panel terminals for gate lines and drain lines generally implemented by a metallic film 733 and an ITO (Indium-Tin-Oxide) film 732 for connection to external terminals (or TCP leads) of the drive IC (TCP). The TFT panel further includes a protrusion including a second metallic film 735 having a lower resistance compared to the first metallic film 733 and connected to the first metallic film 733 through a via-hole formed in the ITO film 732 and an overcoat film 734 covering the second metallic film 735 for protection thereof against corrosion. A slit 737 is formed in the first metallic film 733 of the panel terminal along the longitudinal direction of the stopper 738 for allowing inspection to assure suitable connection of the panel terminal to the TCP lead of the drive IC.

FIG. 2 shows the step of connection of the panel terminal shown in FIGS. 1A and 1B to the TCP lead, wherein an insulator film 736 mounting thereon TCP leads 730 of the drive IC is depicted as overlying the TFT panel. The TCP leads 730 are bonded to the ITO film 732 of the panel terminals by using a thermal-press technique and anisotropic conductive film (ACF). In the conventional technique, the TCP lead 730 is disposed to oppose the first metallic film 733 and not to oppose the second metallic film 735 of the panel terminals.

The state of the connection of the TCP lead 730 to the panel terminal can be observed at the edge of the TCP lead 730 through the slit 737 formed in the first metallic film 733 by observation from the rear of the TFT panel (or from the bottom of the figure), so long as the TCP lead 730 is positioned at a suitable location relative to the TFT panel.

The relative location is such that if the location of the TCP lead 730 of the drive IC is deviated toward left from the design position during connection for the drive IC, the TCP lead 730 cannot be observed through the slit 737 during or after the connection. On the other hand, if the location of the TCP lead 730 of the drive IC is deviated toward right, the TCP lead 730 can be observed through the entire width of the slit 737.

The LCD device described in the above publication has a disadvantage in that observation of the TCP lead 730, such as by human eyes, is difficult unless the terminal pitch of the TCP leads 730 and the width of the silt 737 is sufficiently large. The observation by human eyes does not in fact afford an accurate judgement as to whether the TCP lead 730 of the drive IC is positioned at a suitable location.

More specifically, the accuracy of the observation by human eyes depends on the contrast of the light intensity caused by the absence or presence of shielding of the passing light by the TCP lead 730. In this respect, deviation of the drive IC toward right can be effectively judged by simply determining an absence or presence of the light passing through the slit 737. On the other hand, deviation of the TCP lead 730 toward left cannot be effectively judged because the judgement must distinguish a difference between the light intensities of the passing light. This situation will not be improved even if two slits are provided for respective edges of the TCP lead 730.

Thus, the observation through the slit 737 necessitates a specific inspection step by using a microscope or a CCD camera. This raises the number of steps for the manufacture of the LCD device and the costs for the fabrication facility, both of which raise the costs of the final products.

In addition, even if the judgement is correct, it is difficult to conduct the repair of the TCP leads 730, wherein the TCP leads 730 positioned at wrong locations are replaced by new TCP leads or shifted toward the correct location after removing the ACF. This difficulty is especially caused by the second metallic film 735 and the overcoat film 734 protruding from the ITO film 732 and thus liable to peel-off during removal of ACF residual in the repair. The peel-off of the second metallic film increases the resistance of the panel terminal, which is undesirable.

SUMMARY OF THE INVENTION

In view of the above, it is an object of the present invention to provide a LCD panel unit for a LCD device, including panel terminals having slits therein for effectively allowing observation of the connection between the panel terminals and TCP leads of the drive unit.

It is another object of the present invention to provide a method for fabricating such a LCD panel unit.

It is another object of the present invention to provide a method for manufacturing the LCD device as described above.

The present invention provides a LCD panel unit for use in a LCD device, comprising a pair of glass substrates sandwiching therebetween liquid crystal for defining an array of LCD pixels, a plurality of first signal lines each disposed for a corresponding row of the LCD pixels, a plurality of second signal lines each disposed for a corresponding column of the LCD pixels, each of the first signal lines and the second signal lines having an panel terminal to be connected to a lead of a drive unit for the LCD panel unit, at least one of the panel terminals having a slit section therein for allowing light to pass therethrough, the slit section including at least one slit having a center substantially aligned with a center of the panel terminal, as viewed in a width direction of the slit normal to an extending direction of a corresponding one of the signal lines.

The present invention also provides a method for fabricating a LCD panel comprising the steps of forming a first glass panel having an array of LCD pixels and signal lines for driving the LCD pixels, forming a second glass panel, bonding the first glass panel and the second glass panel together to form a LCD panel unit, the first glass panel forming step includes the step of forming a slit section including at least one slit in a panel terminal of each of the signal lines, the slit having a center substantially aligned with a center of the terminal.

In accordance with the present invention, the slit formed in the panel terminal of the LCD panel unit affords an effective inspection as to whether or not the TCP lead is aligned with the panel terminal, because the alignment can be assured substantially by detecting an absence or presence of the light passing through the slit.

PREFERRED EMBODIMENTS OF THE INVENTION

Figure 1A:
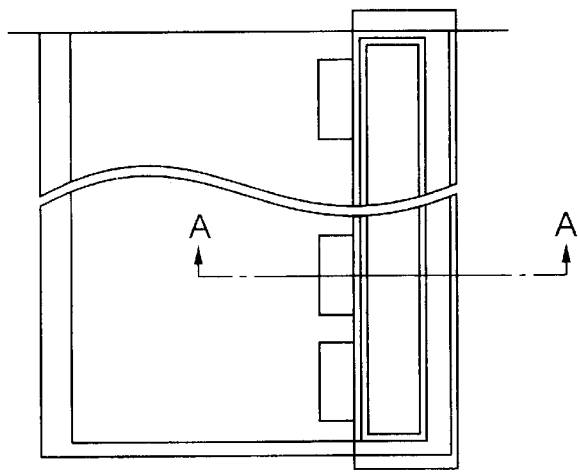
FIG. 1A is a front view of a conventional LCD panel unit.
Figure 1B:
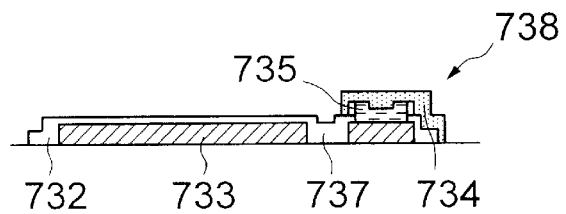
FIG. 1B is a sectional view taken along line A—A in FIG. 1A.
Figure 2:
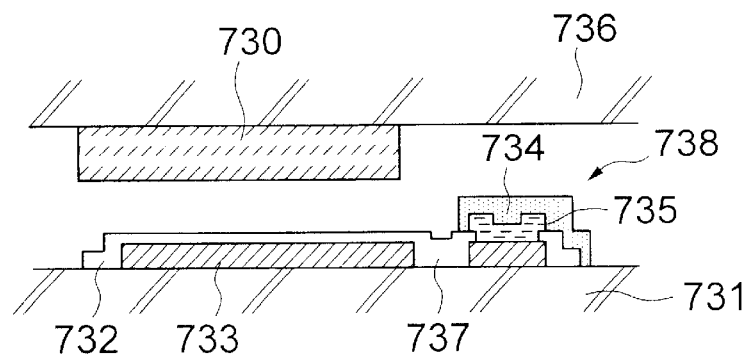
FIG. 2 is a detailed sectional view of the TFT panel in the LCD panel unit of FIG. 1A for showing the locational relationship between external terminal (or TCP lead) and a panel terminal.
Figure 3:
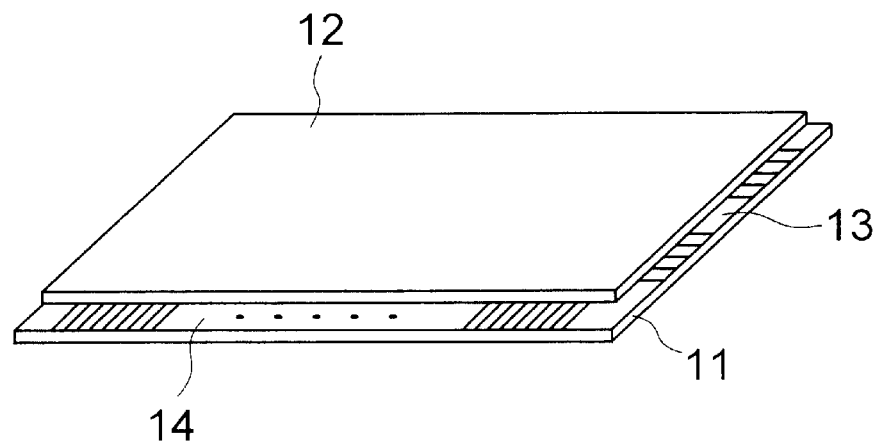
FIG. 3 is a perspective view of a LCD panel unit according to a first embodiment of the present invention.

Referring to FIG. 3, there is shown a LCD panel unit of an active-matrix LCD device according to a first embodiment of the present invention, which is obtained after the steps of adhering a glass TFT panel 11 and a glass color filter panel 12 together by an adhesive, and injecting therebetween liquid crystal to define a two-dimensional array of LC pixels. The TFT panel 11 includes first panel terminal array 13 for gate lines disposed in the vicinity of the right edge of the TFT panel 11 and each connected to gates of the TFTs of LCD pixels arranged in a row of the LCD pixel, and second panel terminal array for drain lines disposed in the vicinity of the bottom edge of the TFT panel 11 and each connected to drains of the TFTs of LCD pixels arranged in a column. The panel terminals 13 and 14 are connected to external terminals (or TCP leads) of a LCD drive unit or TCP (tape carrier package).

Figure 4:
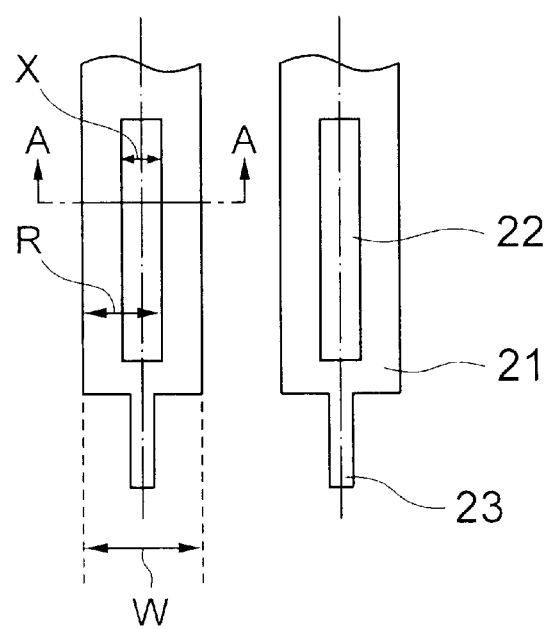
FIG. 4 is a front view of a TFT panel in the LCD panel unit of FIG. 3 for showing panel terminals and slits thereof.

Referring to FIG. 4 showing panel terminals for gate lines or drain lines in the LCD panel unit of FIG. 3, the panel terminals 21 having an elongate shape extend parallel to one another and each has therein a slit 22 having an elongate shape. The center of the slit 22 is substantially aligned with the center of the panel terminal 21. The panel terminal 21 is made of a shield metallic film having a width "W", the slit 22 has a width "X" and the distance between the left-side edge of the panel terminal 21 and the right-side edge of the corresponding slit 22 is shown by reference symbol "R", which defines an overlapping distance needed for connection between the panel terminal 21 and the corresponding TCP lead. The panel terminal 21 is connected to the TCP lead of the LCD drive unit (TCP) through an anisotropic conductive film (ACF). In FIG. 4, the panel terminals 21 extend toward the top of the figure to be connected to TFTs in the LCD pixels. The panel terminal 21 has an extension 23 which protrudes from the end of the panel terminal 21 and had functioned for suppression of electrostatic breakdown of the panel terminal 21 before a sheet metal including the plurality of panel terminals was cut into separate panel terminals.

The width "X" of the slit 22 is designed in the present embodiment to have the following relationship with respect to the width "W" of the panel terminal 21 and the overlapping distance "R" needed for connection:

$$X=2R-W.$$

This relationship affords suitable inspection for determining or detecting a suitable alignment between the TCP lead and the panel terminal when the TCP lead is observed through the slit 22 during or after the connection.

Figure 5:
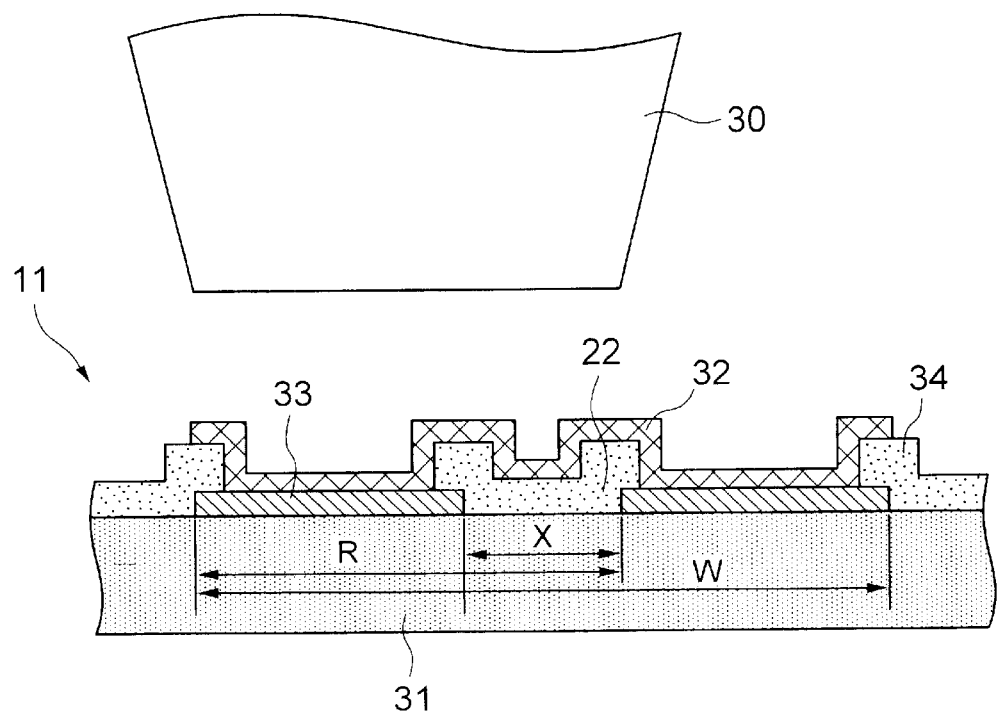
FIG. 5 is a detailed sectional view of the TFT panel in the first embodiment for showing locational relationship between the TCP lead and a panel terminal in the LCD panel unit of FIG. 3.

Referring to FIG. 5 taken along line A—A in FIG. 4, the TFT panel 11 includes a glass TFT substrate 31, a shield metallic film 33 formed on the TFT substrate 31 for implementing the panel terminal 21 having- therein the slit 22, an insulator film 34 formed on a portion of the panel terminal for protecting the structure of the panel terminal, and an ITO film 32 covering the shield metallic film 33 and the overcoat film 34. A TCP lead 30 is shown as opposed to the shield metallic film 33 of the panel terminal before bonding the TCP lead 30 to the panel terminal.

Figure 6:
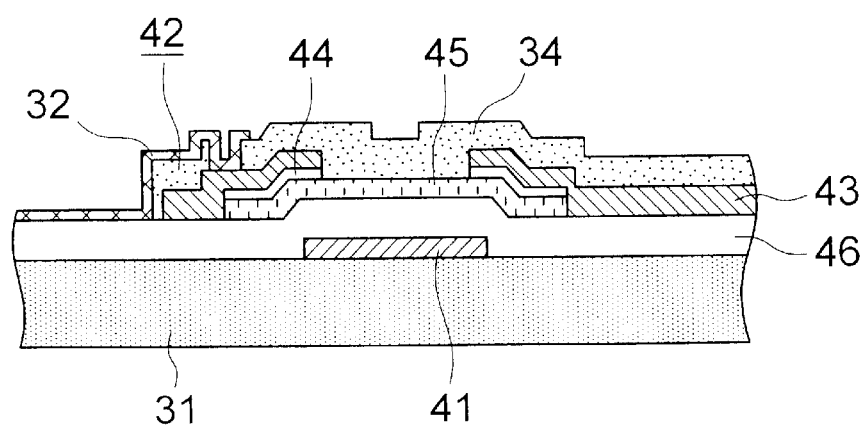
FIG. 6 is a sectional view of the TFT panel for showing the structure of the TFT in a LCD pixel of the LCD panel unit of FIG. 3.

Referring to FIG. 6, there is shown a TFT area of the LCD panel unit which includes a TFT of the LCD pixel. The TFT includes a gate electrode 41 formed on the TFT substrate 31, an interlevel dielectric film 46 formed on the gate electrode 41 and the TFT substrate 31, a silicon film 45 overlying the gate electrode 41 for acting as a channel region of the TFT, a pair of $n^+$-type source/drain regions 44 formed on both ends of the silicon film 45, an electrode film including a pair of electrodes 42 and 43 connected to the $n^+$-type source/drain regions 44, an insulator film (overcoat film) 34 covering the TFT area, and an ITO film 32 connected to the source electrode 42. The drain electrode 44 extends toward the panel terminal not shown.

Referring to FIGS. 7A to 7E, there are shown fabrication steps for fabricating the structure of the LCD panel unit of the first embodiment. Each of FIGS. 7A to 7E shows one of the first panel terminals for gate lines and one of the second panel terminals for drain lines at the left and right sides, respectively, of the drawing.

Figure 7A:
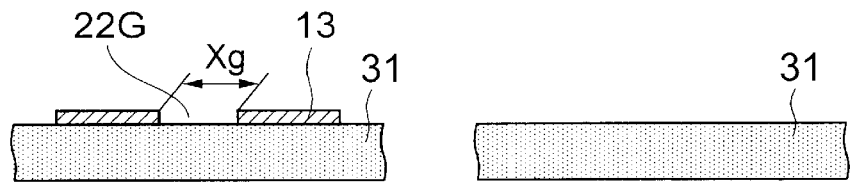
FIGS. 7A to 7E are sectional views consecutively showing the TFT panel during fabrication thereof.

In the step shown in FIG. 7A, a chrome (Cr) film is deposited on the TFT substrate 31 by sputtering to a thickness of about 2000 angstroms, followed by etching thereof for patterning to form the first panel terminals 13 for the gate lines. The panel terminal 13 for the gate line has therein a slit 22G having a width of Xg and a specified length. The shield metallic film implementing the gate line 13 constitutes the gate electrode 41 at the TFT area shown in FIG. 5.

Figure 7B:
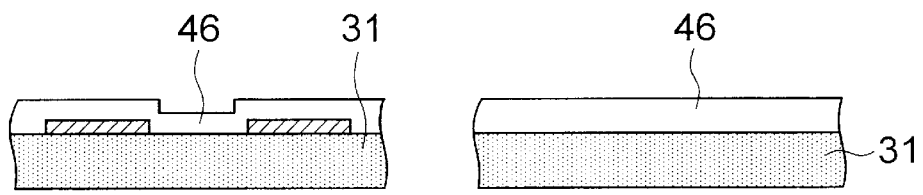

In the step shown in FIG. 7B, a composite film including $SiO_2$ film and SiNx film is deposited on the entire surface to a thickness of 5000 angstroms to form the interlevel dielectric film 46. In the subsequent step, an undoped amorphous silicon film and an $n^+$-type amorphous silicon film are consecutively deposited on the entire surface to a thickness of 2000 angstroms and to a thickness of 200 angstroms, respectively, by using a CVD system. The undoped amorphous silicon film and the $n^+$-type amorphous silicon film are then subjected to patterning to form island conductive films in each TFT area, not shown. The portion of the interlevel dielectric film 46 underlying the silicon film constitutes a gate insulation film of the TFT.

Figure 7C:
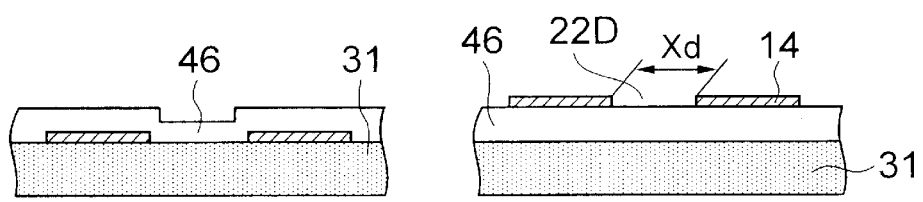

In the step shown in FIG. 7C, another CR film is deposited on the interlevel dielectric film 46 by sputtering to a thickness of about 2000 angstroms, followed by patterning thereof to form drain lines and the panel terminals 14 for the drain lines. The panel terminal 14 for the drain line has a slit 22D having a width of Xd and a specified length. The Cr film constituting the panel terminals 14 and the drain line also constitutes source/drain electrodes 42 and 43 at the TFT area shown in FIG. 6. By these steps shown in FIGS. 7A to 7C, shield metallic films are formed having slits of width "X" (Xg and Xd).

Figure 7D:
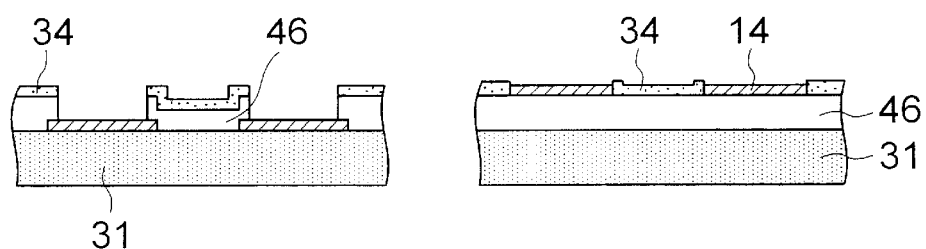

In the step shown in FIG. 7D, a 2000-angstrom-thick silicon nitride film is deposited on the patterned drain lines and the interlevel dielectric film 46 to form an overcoat film 34. Subsequently, via-holes are formed in the interlevel dielectric film 46 and the overcoat film 34 for the gate line area, and in the overcoat film 34 for the drain line area.

Figure 7E:
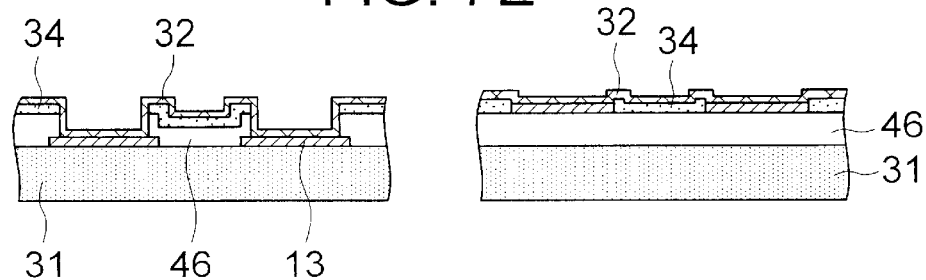

In the step shown in FIG. 7E, an ITO film 32 is deposited on the entire surface of the overcoat film including the via-holes by sputtering to a thickness of about 500 angstroms, followed by patterning thereof to form pixel electrodes to be connected to the respective source electrodes 42. In these drawings, the height of the surface protrusions in the TFT panel is exaggerated compared to the horizontal length thereof. The entire surface is substantially flat and suited for thermal-press bonding to the TCP lead.

The steps shown in FIGS. 7A to 7E provide a TFT panel 11 having panel terminals according to the embodiment. The TFT panel 11 is bonded onto a color filter panel 12 by using a seal resin, and liquid crystal is injected to the space between the TFT panel 11 and the color filter panel 12 to form a LCD panel unit. The panel terminals of the LCD panel unit is then connected to respective TCP leads of a TCP via an ACF to form a LCD device by using a thermal-press bonding technique. In the configuration of the present embodiment, the slits 22 formed in the shield metallic films 13 and 14 allows light to pass therethrough for observation of the TCP leads.

Figure 8:
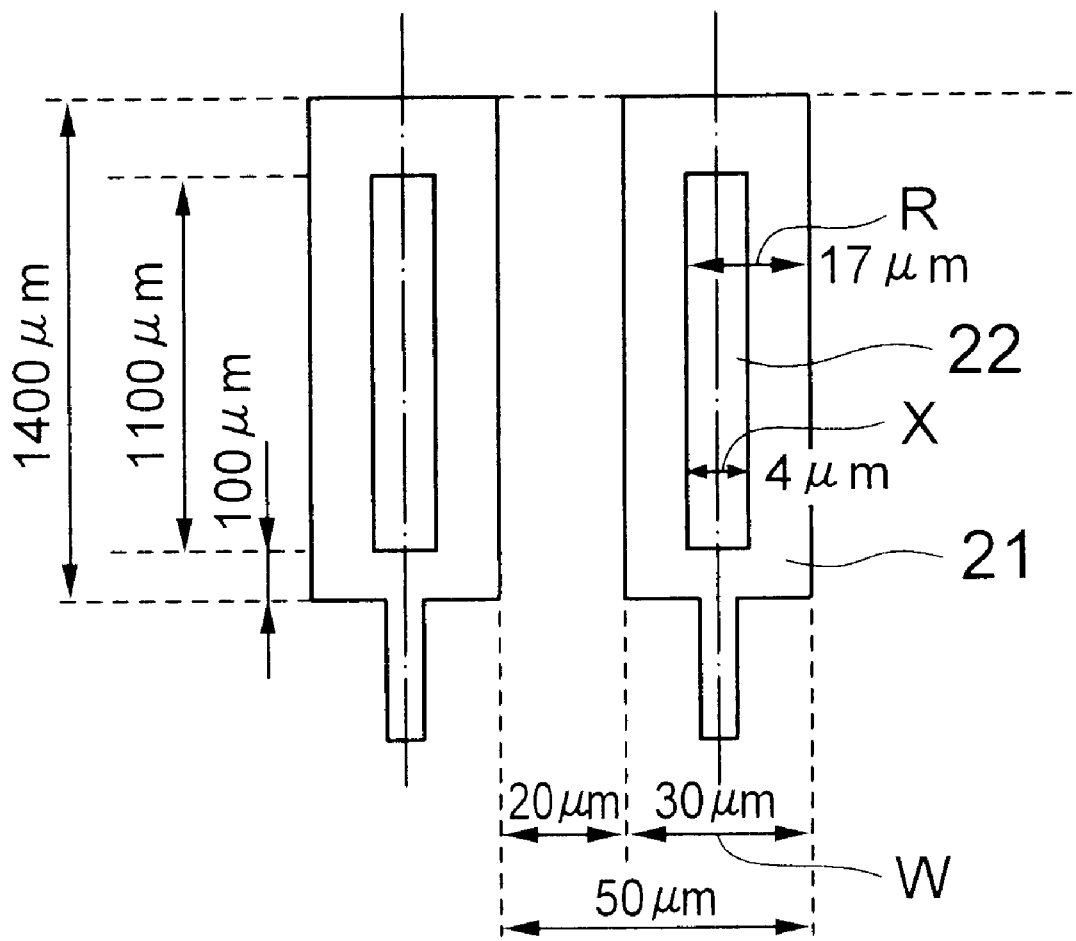
FIG. 8 is a front view of the panel terminals in the TFT panel unit of FIG. 3 for showing the detail of the slits.

Referring to FIG. 8 showing exemplified, practical dimensions for the panel terminals 21 and the slits 22 formed according to the present embodiment, the panel terminal 21 had a width "W" of 30 $\mu$m, a space of 20 $\mu$m between the same and an adjacent panel terminal 21, and a length of 1.4 mm. The head of the thermal-press tool used for the bonding had a width of 1.0 mm, the ACF had a width of 1.2 mm, and the TCP lead 30 was formed by a copper film having a thickness of 15 $\mu$m and a width of 20 $\mu$m at the lead terminal.

The overlapping distance "R" needed for suitable connection between the panel terminal and the TCP lead in view of the function of the ACF was specified at 17 $\mu$m in this example. Thus, the width "X" of the slit 22 was calculated in at 4 $\mu$m from the equation X=2R-W. The length of the slit was selected at 1.1 mm in consideration of the terminal length and the width of the head of the thermal-press bonding tool.

Figure 9A:
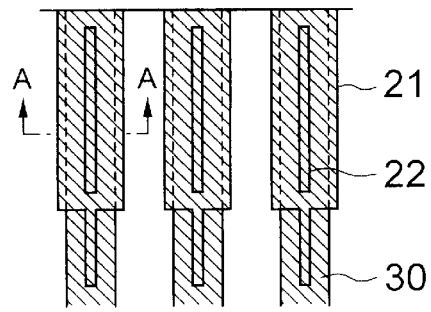
FIGS. 9A and 9B are a front view and a sectional view, respectively, of the TFT panel unit of the first embodiment, showing relative locations between the slits and the TCP leads during thermal-press bonding, in the case of smaller locational deviation.
Figure 9B:
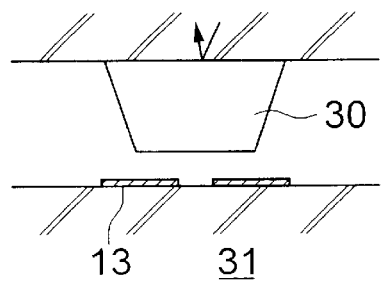
Figure 10A:
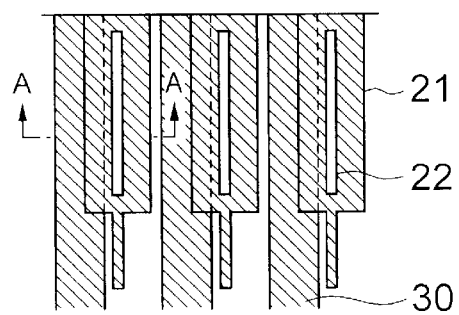
FIGS. 10A and 10B are front view and a sectional view, respectively, of the TFT panel unit of the first embodiment, showing relative locations between the slits and the TCP leads during thermal-press bonding, in the case of larger locational deviation.
Figure 10B:
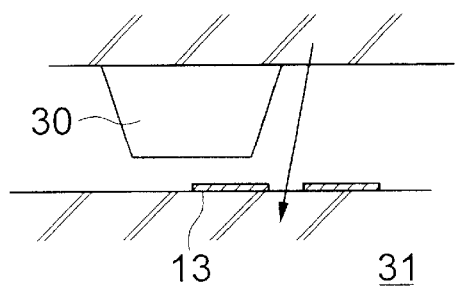

Referring to FIGS. 9A and 9B, there is shown a bonded structure wherein the thermal-press bonding between the panel terminals 21 and the TCP leads 30 are conducted with an allowable deviation. In this case, the light irradiated from above the TCP leads 30 is reflected by the TCP lead 30 and the panel lead 21, whereby the slit 22 does not pass the light. On the other hand, as shown in FIGS. 10A and 10B, if location of the TCP lead 30 deviates with respect to the panel terminals beyond the allowable level, the light irradiated from above the TCP leads 30 passes the slit 22 formed in the panel terminal 22, and is detected by inspection. The presence or absence of the light passing the slit can be effectively distinguished by human eyes to determine whether or not the deviation is within the allowable level. This effect can be especially obtained by the configuration wherein X=2R-W.

Figure 11:
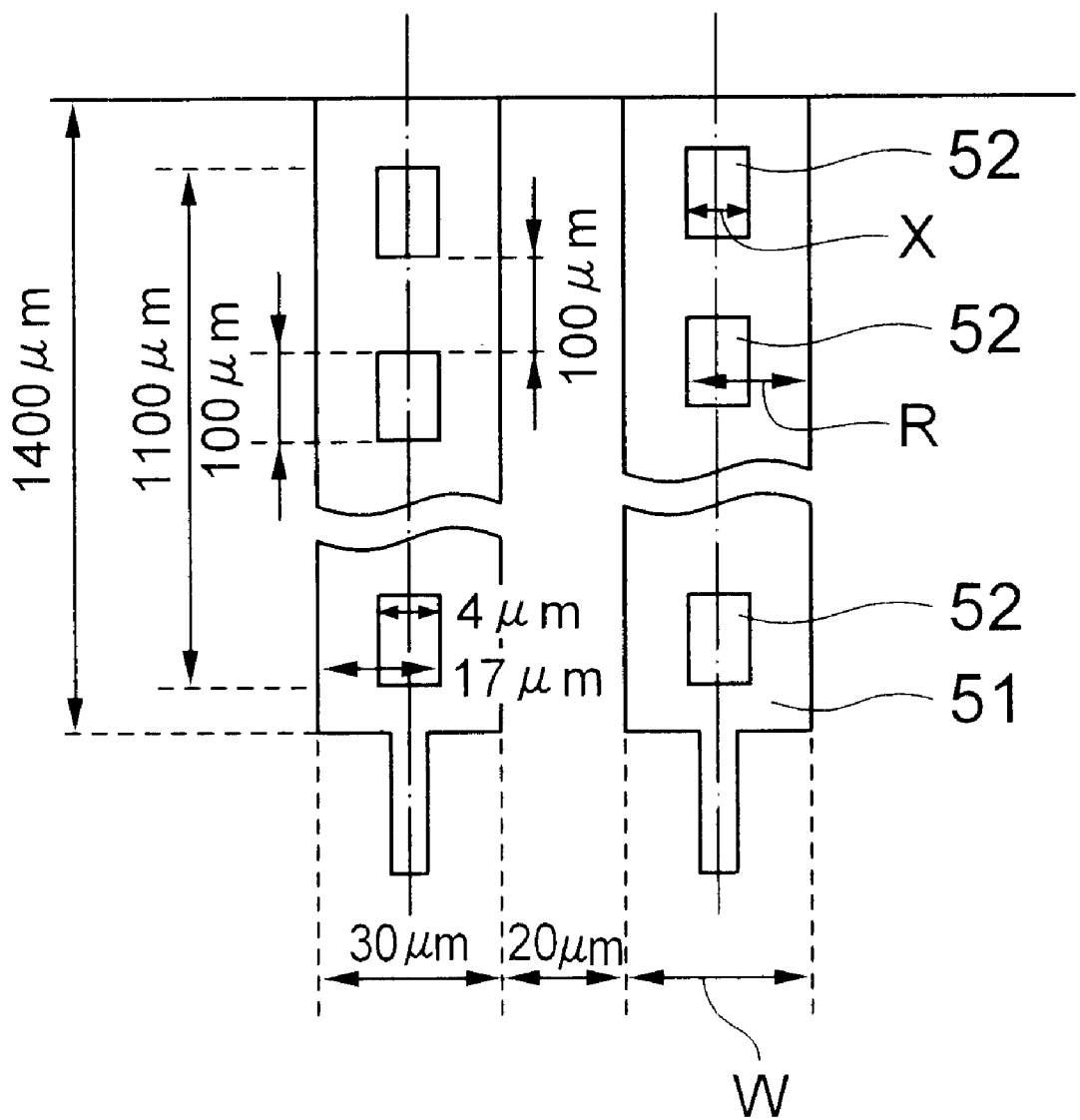
FIG. 11 is a front view of the panel terminals in a LCD panel unit according to a second embodiment of the present invention for showing details of the slits therein.

Referring to FIG. 11, a LCD panel unit according to a second embodiment of the present invention is similar to the first embodiment except that a plurality of slits 52 each having a smaller length are arranged along the extending direction of the panel terminal 51 to form a slit section. In an exemplified, practical arrangement, the panel terminal has a length of 1400 $\mu$m, a width of 30 $\mu$m, and a space of 20 $\mu$m between the same and an adjacent panel terminal 51. The slit section of the panel terminal 21 includes five slits 22 arranged in the extending direction of the panel terminal, with the space being 100 $\mu$m between adjacent slits. Each slit 22 has a length of 100 $\mu$m and a width of 4 $\mu$m.

Figure 12A:
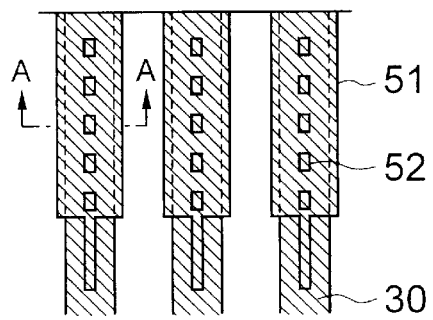
FIGS. 12A and 12B are front view and a sectional view, respectively, showing relative locations between slits and TCP leads during thermal-press bonding in the case of smaller locational deviation.
Figure 12B:
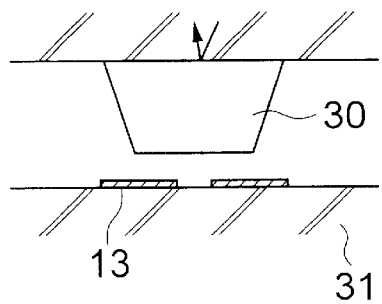
Figure 13A:
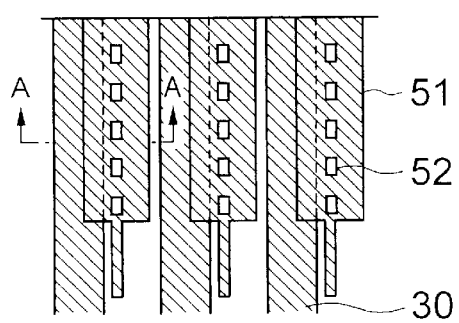
FIGS. 13A and 13B are front view and a sectional view, respectively, showing relative locations between slits and TCP leads during thermal-press bonding in the case of larger locational deviation.
Figure 13B:
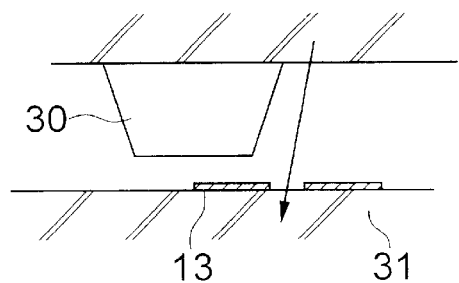

Referring to FIGS. 12A and 12B showing, similarly to FIGS. 9A and 9B, the bonded state of the panel terminals 51 in the present embodiment wherein the bonding is conducted within an allowable deviation, the slits 52 do not pass the light irradiated from above the TCP leads 30. On the other hand, as shown in FIGS. 13A and 13B, if the deviation exceeds an allowable level, the slits 52 pass the light for allowing detection of the deviation exceeding the allowable level. In this embodiment, since the plurality of slits 52 pass light patterns arranged with a constant pitch along the extending direction of the panel terminals 51, the light patterns can be distinguished from the elongate light passing through the space between the adjacent panel terminals 51.

In the configuration of the second embodiment, even if the space between the panel terminals 51 is small due to a small pitch of the panel terminals 51, the light passing the slit section can be effectively detected for inspection of the deviation between the locations of the TCP lead 30 and the panel terminal 51.

Figure 14:
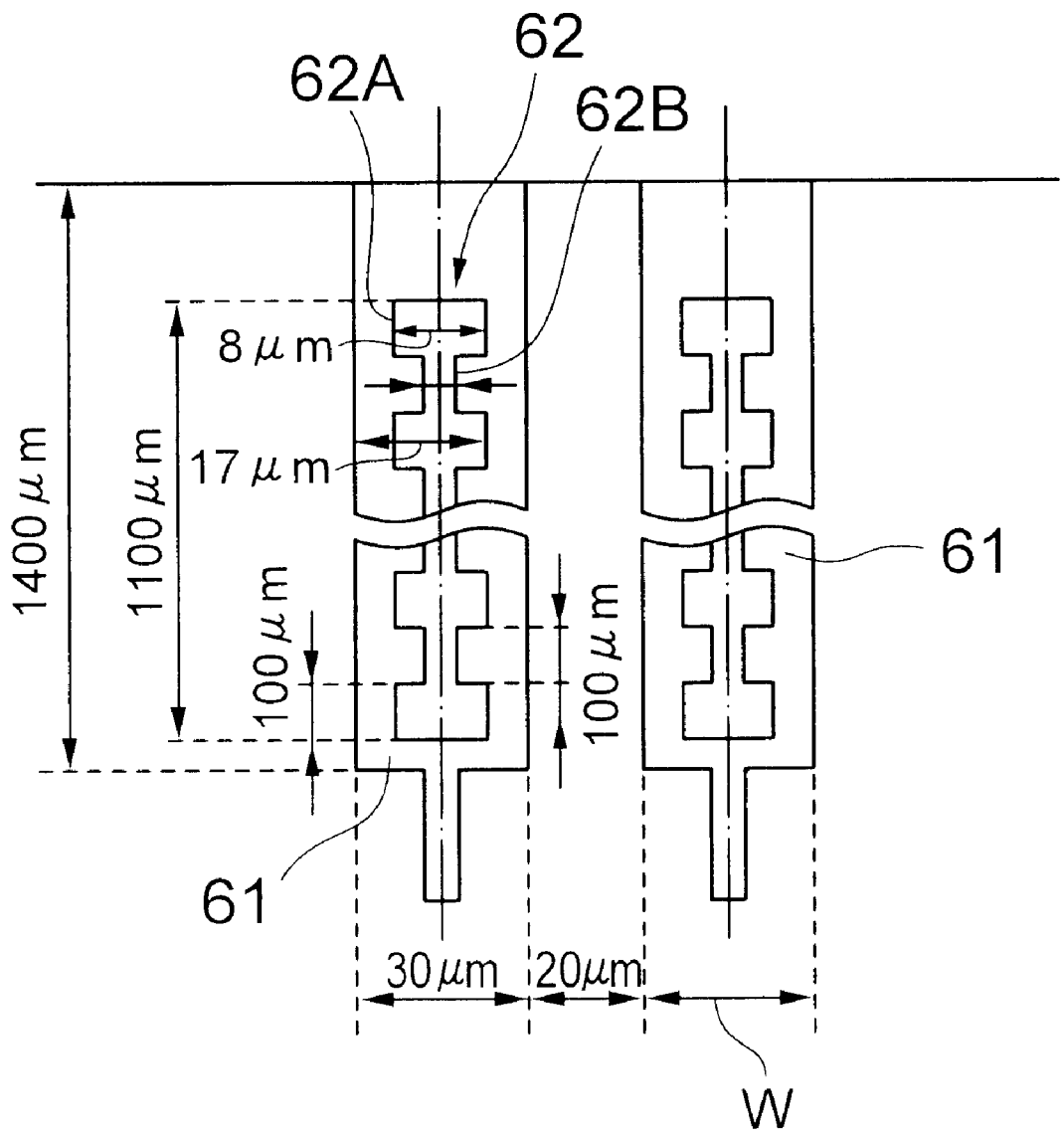
FIG. 14 is a front view of the TFT panel in a LCD device according to a third embodiment of the present invention for showing details of the slits therein.

Referring to FIG. 14, a LCD panel unit according to a third embodiment of the present invention is similar to the first embodiment except that the slit section 62 includes a plurality of large width slits 62A and a plurality of small width slits 62B arranged alternately along the extending direction of the panel terminal 61. In an exemplified, practical example, with the dimensions of the panel terminals 61 being similar to those of the panel terminals 51 in the second embodiment, the large width slit 62A has a width (X1) of 8 μm and a length of 100 μm whereas the small width slit 62B has a width (X2) of 4 μm and a length of 100 μm.

In the third embodiment, it is designed that R>X1>X2 for the slit. The overlapping distance "R" is selected at 19 μm for effectively inspecting the deviation between the panel terminal and the TCP lead. The large width of 8 μm is determined based on the overlapping distance "R" of 19 μm. A large width slit 62A and an adjacent small width slit 62B may be separated by an opaque portion which does not pass the light.

Figure 15A:
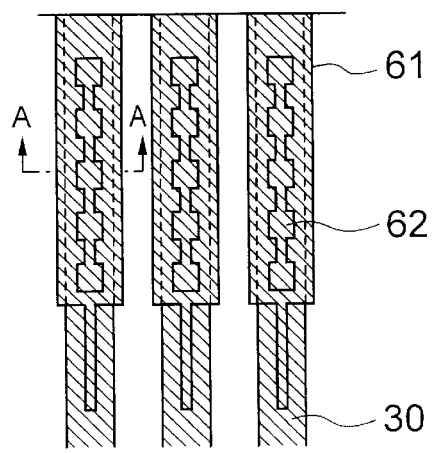
FIGS. 15A to 15C are front views of the panel terminals of FIG. 14 for showing relative locations between the slits and the TCP leads during thermal-press bonding, in the cases of smaller locational deviation, larger locational deviation and another larger locational deviation, respectively.
Figure 15B:
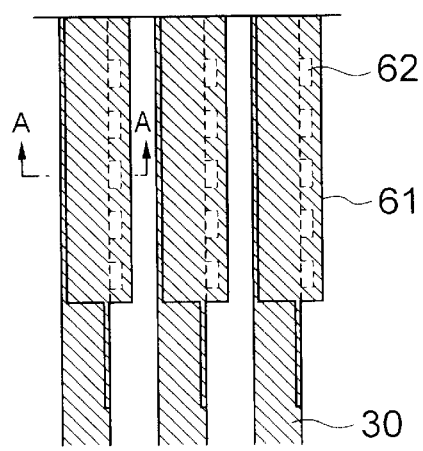
Figure 15C:
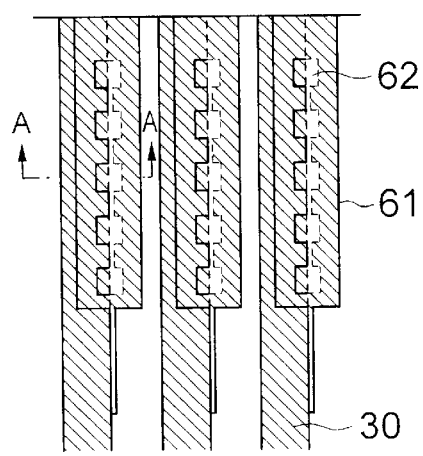

Referring to FIGS. 15A to 15C, there are shown different cases for the deviation between the panel terminal 61 and the TCP lead 30. In FIG. 15A, since the deviation is within a specified threshold which is smaller than an allowable level, the light passing the slit section 62 is not detected. In FIG. 15B, since the deviation is between the specified threshold and the allowable level, the light passing through the large width slit 62A is detected. Although the product LCD panel unit passes the inspection test, the fabrication facility is examined as to which part causes the relatively larger deviation. In FIG. 15C, since the deviation is beyond the allowable level, the light passing through the large width slit 62A and the small width slit 62B is detected. In this case, the product LCD panel unit is discarded as a failed product.

In the configuration of the present embodiment, the fabrication facility can be repaired without producing a failed product, thereby raising the throughput of the LCD panel units.

Since the above embodiments are described only for examples, the present invention is not limited to the above embodiments and various modifications or alterations can be easily made therefrom by those skilled in the art without departing from the scope of the present invention.

For example, the shield metallic film may be made of other metals such as Al, Mo, and Ta or an alloy including these metals, and also may have a two- or more-layer structure including these metals or alloys.

The slit or slit section may be of any shape, dimensions and location so long as the center of the slit section is aligned with the center of the panel terminal. In a preferred embodiment, the slit or slit section has a width equal to or larger than 4 μm and a total length equal to or larger than 0.5 mm in view of effective inspection of the passing light. The slit section is preferably located in the vicinity of the end of the panel terminal, thereby suppressing the increase of the resistance of the panel terminal caused by the slit.

What is claimed is:

1. A method for fabricating a LCD panel comprising:
   forming a first glass panel having an array of LCD pixels and signal lines for driving the LCD pixels;
   forming a second glass panel; and
   bonding the first glass panel and the second glass panel together to form a LCD panel unit,
   wherein forming the first glass panel comprises forming a slit section including at least one slit in a panel terminal of each of the signal lines, the slit having a center substantially aligned with a center of the terminal, an edge of a slit defining a predetermined minimum desired overlapping distance of a lead with the panel terminal such that a lead having an edge visible through the slit is indicated to have insufficient alignment with the panel terminal, and
   wherein bonding the first glass panel and the second glass panel comprises detecting the edge of a lead through the slit in the corresponding panel terminal in order to determine improper alignment of the panels and aligning the first glass panel and the second glass panel such that edges of leads are not visible within slits of corresponding panel terminals.

2. The method as defined in claim 1, wherein the following relationship:

$$X=2R-W$$

substantially holds, wherein X is a width of the slit section, R is a predetermined minimum overlap of a lead of the drive unit with the panel terminal, and W is a width of the panel terminal.

3. The method as defined in claim 1, wherein said slit section includes a single elongate slit.

4. A method for fabricating a LCD panel comprising:
   forming a first glass panel having an array of LCD pixels and signal lines for driving the LCD pixels;
   forming a second glass panel; and
   bonding the first glass panel and the second glass panel together to form a LCD panel unit,
   wherein forming the first glass panel comprises forming a slit section including at least one slit in a panel terminal of each of the signal lines, the slit having a center substantially aligned with a center of the terminal, an edge of a slit defining a predetermined minimum desired overlapping distance of a lead with the panel terminal such that a lead having an edge visible through the slit is indicated to have insufficient alignment with the panel terminal, and
   wherein bonding the first glass panel and the second glass panel comprises aligning the first glass panel and the second glass panel such that edges of leads are not visible within slits of corresponding panel terminals, and
   wherein said slit section includes at least one combination including an elongate slit and an adjacent portion which does not allow the light to pass therethrough.

5. A method for fabricating a LCD panel comprising:
   forming a first glass panel having an array of LCD pixels and signal lines for driving the LCD pixels;
   forming a second glass panel; and
   bonding the first glass panel and the second glass panel together to form a LCD panel unit,
   wherein forming the first glass panel comprises forming a slit section including at least one slit in a panel terminal of each of the signal lines, the slit having a center substantially aligned with a center of the terminal, an edge of a slit defining a predetermined minimum desired overlapping distance of a lead with the panel terminal such that a lead having an edge visible through the slit is indicated to have insufficient alignment with the panel terminal, and
   wherein bonding the first glass panel and the second glass panel comprises aligning the first glass panel and the second glass panel such that edges of leads are not visible within slits of corresponding panel terminals, and
   wherein said slit section includes at least one combination including a large width slit and a small width slit.

\* \* \* \* \*

UNITED STATES PATENT AND TRADEMARK OFFICE
CERTIFICATE OF CORRECTION

PATENT NO. : 6,633,361 B1  
DATED : October 14, 2003  
INVENTOR(S) : Akira Fujita Page 1 of 1

It is certified that error appears in the above-identified patent and that said Letters Patent is hereby corrected as shown below:

<u>Title page,</u>  
Item [30], Foreign Application Priority Data, the correct priority date should read -- June 4, 1999 --.

Signed and Sealed this

Ninth Day of March, 2004

JON W. DUDAS  
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,633,361 B1 | Page 1 of 1 |
| APPLICATION NO. | : 09/587061 | |
| DATED | : October 14, 2003 | |
| INVENTOR(S) | : Akira Fujita | |

It is certified that error appears in the above-identified patent and that said Letters Patent is hereby corrected as shown below:

Title Page,

Under REFERENCES CITED at (56):

Add the following references:
 JP06-003689
 JP04-274412
 JP09-189916
 JP02-221933

Signed and Sealed this

Sixth Day of September, 2011

David J. Kappos
*Director of the United States Patent and Trademark Office*